(12) United States Patent
Ueda et al.

(10) Patent No.: US 9,035,536 B2
(45) Date of Patent: May 19, 2015

(54) PIEZOELECTRIC THIN-FILM RESONATOR AND METHOD FOR MANUFACTURING THE SAME

(75) Inventors: Masanori Ueda, Tokyo (JP); Shinji Taniguchi, Tokyo (JP); Tokihiro Nishihara, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 436 days.

(21) Appl. No.: 13/563,505

(22) Filed: Jul. 31, 2012

(65) Prior Publication Data

US 2013/0033151 A1 Feb. 7, 2013

(30) Foreign Application Priority Data

Aug. 2, 2011 (JP) ................. 2011-169603

(51) Int. Cl.
*H01L 41/09* (2006.01)
*H03H 3/04* (2006.01)
*H03H 9/17* (2006.01)
*H03H 3/02* (2006.01)

(52) U.S. Cl.
CPC . *H03H 3/04* (2013.01); *Y10T 29/42* (2015.01); *H03H 9/171* (2013.01); *H03H 2003/021* (2013.01); *H03H 2003/023* (2013.01); *H03H 2003/025* (2013.01); *H03H 2003/0407* (2013.01)

(58) Field of Classification Search
CPC ........... H03H 3/02; H03H 3/04; H03H 9/171; H03H 2003/021; H03H 2003/023; H03H 2003/025; H03H 2003/0407
USPC .......................... 310/321, 328, 334, 340, 365
See application file for complete search history.

(56) References Cited

U.S. PATENT DOCUMENTS

| 3,078,838 A * | 2/1963 | Broecker ................. 126/110 R |
| 4,456,850 A | 6/1984 | Inoue et al. |
| 5,925,973 A * | 7/1999 | Eda et al. .................... 310/348 |
| 2005/0035829 A1 | 2/2005 | Umeda et al. |
| 2005/0073505 A1 | 4/2005 | Katsuki et al. |
| 2006/0097823 A1 | 5/2006 | Fujii et al. |

(Continued)

FOREIGN PATENT DOCUMENTS

| CN | 1606179 A | 4/2005 |
| CN | 101931046 A | 12/2010 |

(Continued)

OTHER PUBLICATIONS

Zou et al., "High Coupling Coefficient Temperature Compensated FBAR Resonator for Oscillator Application with Wide Pulling Range", IEEE International Frequency Control Symposium (FCS), 2010, pp. 646-651.

(Continued)

*Primary Examiner* — Thomas Dougherty
(74) *Attorney, Agent, or Firm* — Chen Yoshimura LLP

(57) ABSTRACT

A piezoelectric thin-film resonator includes: a lower electrode provided on a substrate; a piezoelectric film that is provided on the lower electrode and includes at least two layers; an upper electrode that is provided on the piezoelectric film and has a region sandwiching the piezoelectric film with the lower electrode and facing the lower electrode; and an insulating film that is provided in a region in which the lower electrode and the upper electrode face each other and between each of the at least two layers, wherein an upper face of the insulating film is flatter than a lower face of the insulating film.

11 Claims, 9 Drawing Sheets

(56) References Cited

U.S. PATENT DOCUMENTS

| | | | |
|---|---|---|---|
| 2007/0028692 A1* | 2/2007 | Liu | 73/584 |
| 2007/0120625 A1 | 5/2007 | Larson, III et al. | |
| 2007/0152540 A1 | 7/2007 | Fujii et al. | |
| 2007/0221494 A1* | 9/2007 | Yamada et al. | 204/192.22 |
| 2008/0169728 A1* | 7/2008 | Asai et al. | 310/334 |
| 2010/0320871 A1 | 12/2010 | Suenaga et al. | |
| 2013/0033151 A1* | 2/2013 | Ueda et al. | 310/318 |
| 2014/0167566 A1* | 6/2014 | Kando | 310/360 |

FOREIGN PATENT DOCUMENTS

| | | | |
|---|---|---|---|
| JP | 58-137317 A | | 8/1983 |
| JP | 1-216556 A | * 8/1989 | H01L 21/88 |
| JP | 2002-372974 A | | 12/2002 |
| JP | 2005-94735 A | | 4/2005 |
| JP | 2006-166419 A | | 6/2006 |
| JP | 2007-159123 A | | 6/2007 |
| JP | 2008-48040 A | | 2/2008 |
| WO | 2006/067949 A1 | | 6/2006 |

OTHER PUBLICATIONS

Yokoyama et al., "New Electrode Material for Low-loss and High-Q FBAR Filters", IEEE Ultrasonics Symposium, 2004, pp. 429-432.

Chinese Office Action dated Oct. 10, 2014, in a counterpart Chinese patent application No. 201210272191.8.

Japanese Office Action dated Jan. 6, 2015, in a counterpart Japanese patent application No. 2011-169603.

* cited by examiner

PIEZOELECTRIC THIN-FILM RESONATOR AND METHOD FOR MANUFACTURING THE SAME

CROSS-REFERENCE TO RELATED APPLICATION

This application is based upon and claims the benefit of priority of the prior Japanese Patent Application No. 2011-169603, filed on Aug. 2, 2011, the entire contents of which are incorporated herein by reference.

FIELD

A certain aspect of the present invention relates to a piezoelectric thin-film resonator and a method for manufacturing a piezoelectric thin-film resonator.

BACKGROUND

There is a growing demand for small and light resonators and filters having the resonators, with the rapid spread of mobile communication devices such as a mobile phone unit. Recently, there is developed a filter for high frequency communication that has characteristics of allowing of passing only an electrical signal in a specific frequency range, the characteristics being obtained by combining a surface acoustic wave resonator having a piezoelectric material and a piezoelectric thin-film resonator using thickness vibration of a piezoelectric thin film. An outer shape of a filter using the surface acoustic wave resonator or the piezoelectric thin-film resonator is smaller than that of a dielectric filter. And a Q value of the surface acoustic wave resonator is higher than that of the dielectric filter. Therefore, the surface acoustic wave resonator is appropriate for a high frequency component of a mobile communication device such as a small mobile phone unit for which sharp roll-off characteristics are required. A duplexer is used as an applied component having a ladder type filter of the surface acoustic wave resonator or the piezoelectric thin-film resonator. The duplexer has a function of transmitting and receiving, and is used as a wireless device in which a transmitting signal frequency is different from a receiving signal frequency.

There are a FBAR (Film Bulk Acoustic Resonator) type and a SMR (Solidly Mounted Resonator) type as the piezoelectric thin-film resonator. The piezoelectric thin-film resonator of FBAR type has a lamination structure in which a lower electrode, a piezoelectric film and an upper electrode are laminated on a substrate in this order. A region sandwiching the piezoelectric film between the lower electrode and the upper electrode is a resonance portion. A cavity is formed below the lower electrode of the resonance portion. On the other hand, the piezoelectric thin-film resonator of SMR type has a structure in which an acoustic multilayer film is provided instead of the cavity. The acoustic multilayer film has a structure in which a film having higher acoustic impedance and having a thickness of $\lambda/4$ and a film having lower acoustic impedance and having a thickness of $\lambda/4$ are laminated ($\lambda$: a wavelength of an acoustic wave).

A filter or a duplexer using a piezoelectric thin-film resonator has temperature characteristics of frequency. As the performance of a mobile phone unit or the like gets higher, improvement of the temperature characteristics is needed, and reduction of an absolute value of a temperature coefficient of a frequency such as a resonance frequency or anti-resonance frequency is needed. Japanese Patent Application Publication No. 58-137317 (herein after referred to as Document 1) discloses that a thin film of which sign of a temperature coefficient is opposite to that of a piezoelectric film is provided between piezoelectric films as illustrated in FIG. 5, and an absolute value of the temperature coefficient of frequency is reduced. Qiang Zou, and six people, "High Coupling Coefficient Temperature Compensated FBAR Resonator for Oscillator Application with Wide Pulling Range", Frequency Control Symposium, 2010 IEEE International, p 646-651 discloses that a silicon oxide film acting as a temperature compensation film is provided between a lower electrode and a piezoelectric film as illustrated in FIG. 2, a metal film covers the silicon oxide film, the temperature characteristics of frequency are improved, and an electromechanical coupling coefficient ($K^2$) is improved.

In a piezoelectric thin-film resonator, orientation of a piezoelectric film is one of important elements for determining resonance characteristics. However, the orientation of the piezoelectric film may be disturbed, as in the case of the structure of Document 1 in which the thin film acting as the temperature compensation film is sandwiched by piezoelectric films.

SUMMARY OF THE INVENTION

According to an aspect of the present invention, there is provided a piezoelectric thin-film resonator including: a lower electrode provided on a substrate; a piezoelectric film that is provided on the lower electrode and includes at least two layers; an upper electrode that is provided on the piezoelectric film and has a region sandwiching the piezoelectric film with the lower electrode and facing the lower electrode; and an insulating film that is provided in a region in which the lower electrode and the upper electrode face each other and between each of the at least two layers, wherein an upper face of the insulating film is flatter than a lower face of the insulating film.

According to another aspect of the present invention, there is provided a method for manufacturing a piezoelectric thin-film resonator comprising: forming a lower electrode on a substrate; forming a first piezoelectric film on the lower electrode; forming an insulating film on the first piezoelectric film; flattening an upper face of the insulating film; forming a second piezoelectric film on the insulating film of which upper face is flattened; and forming an upper electrode on the second piezoelectric film so as to have a region sandwiching the first piezoelectric film, the insulating film and the second piezoelectric film with the lower electrode and facing the lower electrode.

DETAILED DESCRIPTION

Figure 1:
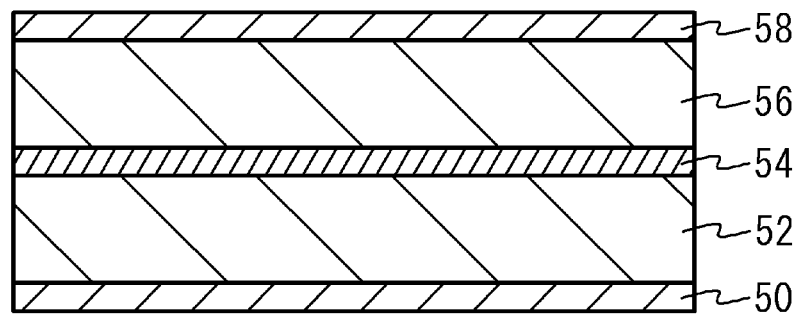
FIG. 1 illustrates a schematic cross sectional view of a resonance portion of a piezoelectric thin-film resonator in accordance with a first comparative example.

A description will be given of a piezoelectric thin-film resonator in accordance with a first comparative example. FIG. 1 illustrates a schematic cross sectional view of a resonance portion of the piezoelectric thin-film resonator. As illustrated in FIG. 1, a first piezoelectric film 52 is formed on a lower electrode 50 by a sputtering method or the like. The lower electrode 50 is made of Ru (ruthenium) or the like. The first piezoelectric film 52 is made of AlN or the like. An insulating film 54 acting as a temperature compensation film is formed on the first piezoelectric film 52 by a sputtering method or the like. A second piezoelectric film 56 is formed on the insulating film 54 by a sputtering method or the like. The second piezoelectric film 56 is made of AlN or the like. The insulating film 54 has a temperature coefficient having a sign that is opposite to a sign of a temperature coefficient of an elastic constant of the first piezoelectric film 52 and the second piezoelectric film 56, because the insulating film 54 acts as the temperature compensation film. The insulating film 54 is made of $SiO_2$ or the like. For example, the insulating film 54 is in contact with an upper face of the first piezoelectric film 52. For example, the second piezoelectric film 56 is in contact with an upper face of the insulating film 54. An upper electrode 58 made of Ru or the like is formed on the second piezoelectric film 56 by a sputtering method or the like.

The lower electrode 50 and the upper electrode 58 sandwich the first piezoelectric film 52 and the second piezoelectric film 56 and face each other. The insulating film 54 is sandwiched by the first piezoelectric film 52 and the second piezoelectric film 56 in a region where the lower electrode 50 and the upper electrode 58 face each other. Thus, an insulating film acting as a temperature compensation film is provided in a region where an upper electrode and a lower electrode face each other. This allows improvement of temperature characteristics of frequency, as described in Document 1.

Figure 2:
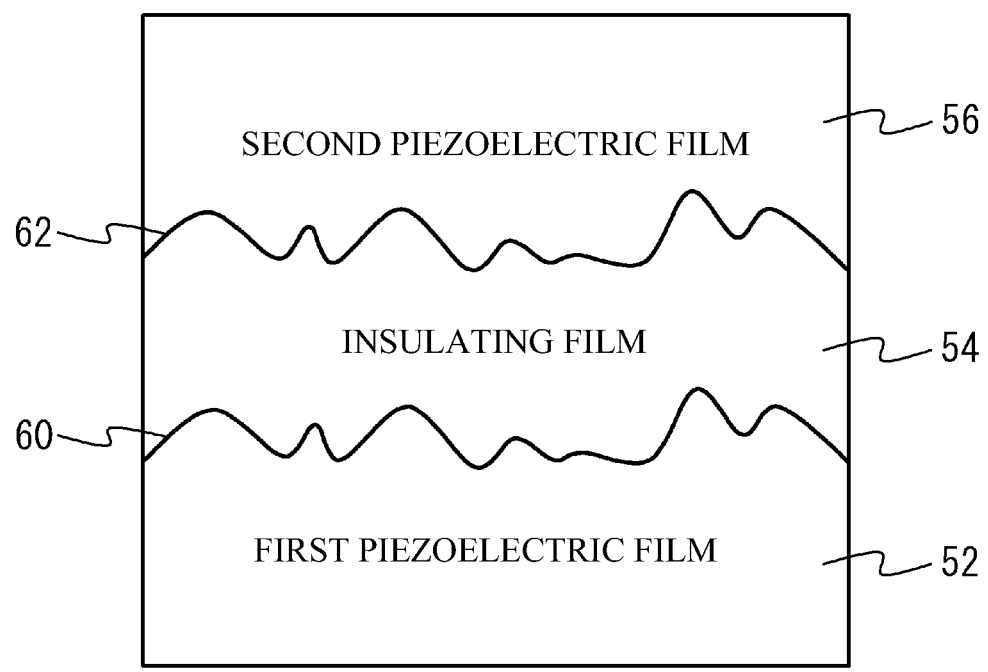
FIG. 2 illustrates a cross sectional view illustrating flatness of an upper face of an insulating film.

A description will be given of flatness of the upper face of the insulating film 54. FIG. 2 illustrates a schematic cross sectional view illustrating the flatness of the upper face of the insulating film 54. As illustrated in FIG. 2, the first piezoelectric film 52 is formed on the lower electrode 50 by a sputtering method or the like, and has a thickness of 0.6 µm or the like. Therefore, flatness of an upper face 60 of the first piezoelectric film 52 is bad. The insulating film 54 is formed by a sputtering method or the like and is in contact with the upper face 60 of the first piezoelectric film 52. The insulating film 54 has a thickness of 25 nm or the like. Therefore, an upper face 62 of the insulating film 54 is subjected to the flatness of the upper face 60 of the first piezoelectric film 52, and has a shape to which the upper face 60 of the first piezoelectric film 52 is transferred. That is, the flatness of the upper face 62 of the insulating film 54 is approximately the same as that of the upper face 60 of the first piezoelectric film 52. Therefore, the flatness of the upper face 62 of the insulating film 54 is also bad. And, the second piezoelectric film 56 is formed in contact with the upper face 62 of the insulating film 54 having bad flatness by a sputtering method or the like.

Thus, the temperature characteristic of frequency may be improved in the piezoelectric thin-film resonator in accordance with the first comparative example, because the insulating film 54 is provided between the first piezoelectric film 52 and the second piezoelectric film 56. However, the second piezoelectric film 56 is provided in contact with the upper face 62 of the insulating film 54 having bad flatness. Therefore, c-axis orientation of the second piezoelectric film 56 is degraded. "New Electrode Material for Low-loss and High-Q FBAR Filters", T. Yokoyama and four people, IEEE Ultrasonic Symposium 2004, p 429-432 discloses that c-axis orientation of a piezoelectric film has large influence on resonance characteristics of a piezoelectric thin-film resonator. Therefore, when the c-axis orientation of the second piezoelectric film 56 is degraded as in the case of the piezoelectric thin-film resonator in accordance with the first comparative example, the resonance characteristics may be degraded.

A description will be given of a piezoelectric thin-film resonator that improves temperature characteristics of frequency, suppresses disturbance of orientation of a piezoelectric film, and achieves favorable resonance characteristics.

First Embodiment

Figure 3A:
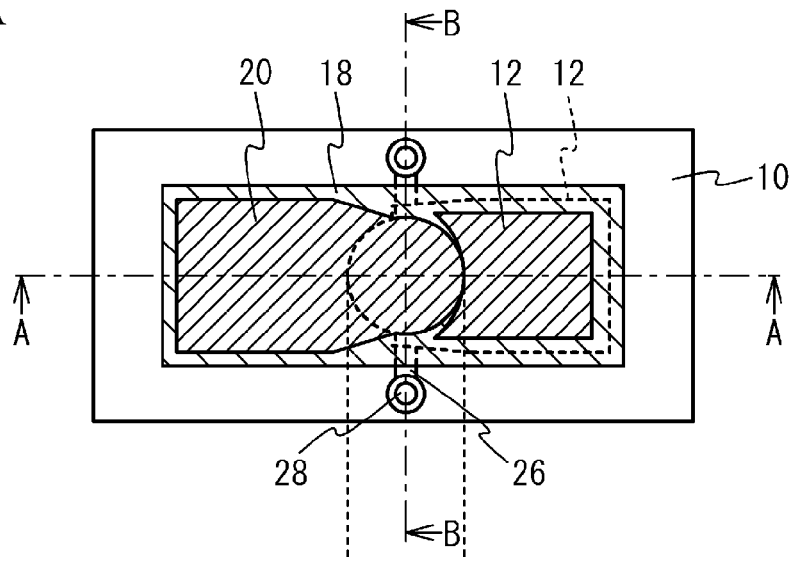
FIG. 3A illustrates a schematic top view of a piezoelectric thin-film resonator in accordance with a first embodiment.
Figure 3B:
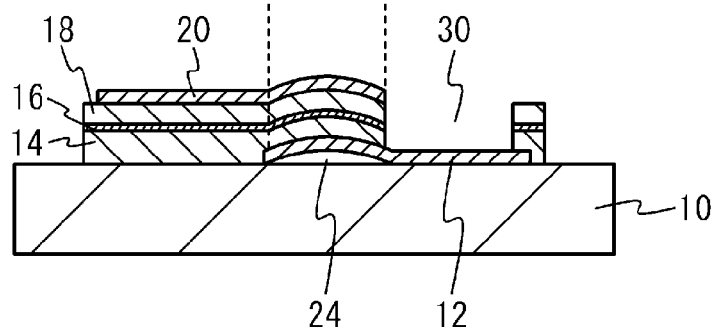
FIG. 3B illustrates a schematic cross sectional view taken along a line A-A of FIG. 3A.
Figure 3C:
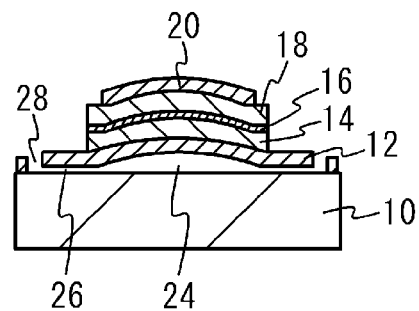
FIG. 3C illustrates a schematic cross sectional view taken along a line B-B of FIG. 3A.

FIG. 3A illustrates a schematic top view of a piezoelectric thin-film resonator in accordance with a first embodiment. FIG. 3B illustrates a schematic cross sectional view taken along a line A-A of FIG. 3A. FIG. 3C illustrates a schematic cross sectional view taken along a line B-B of FIG. 3A. As illustrated in FIG. 3A through FIG. 3C, a lower electrode 12 made of Ru or the like is provided on a substrate 10 made of Si substrate or the like. The thickness of the lower electrode 12 is, for example, 260 nm. A first piezoelectric film 14 made of AlN or the like is provided on the substrate 10 and the lower electrode 12. The thickness of the first piezoelectric film 14 is, for example, 0.6 µm. An insulating film 16 made of $SiO_2$ or the like acting as a temperature compensation film is provided on the first piezoelectric film 14. The thickness of the insulating film 16 is, for example, 25 nm. For example, the insulating film 16 is provided on the upper face of the first piezoelectric film 14 and is in contact with the upper face of the first piezoelectric film 14. Details are described later. The flatness of the upper face of the insulating film 16 is worse than that of the lower face.

A second piezoelectric film 18 made of AlN or the like is provided on the insulating film 16. The thickness of the second piezoelectric film 18 is, for example, 0.6 µm. The second piezoelectric film 18 is provided on the upper face of the insulating film 16 and is in contact with the upper face of the insulating film 16. An upper electrode 20 made of Ru or the like is provided on the second piezoelectric film 18 and has a region that sandwiches the first piezoelectric film 14, the insulating film 16 and the second piezoelectric film 18 with the lower electrode 12 and face the lower electrode 12. The thickness of the upper electrode 20 is, for example, 260 nm. The region where the lower electrode 12 and the upper electrode 20 face each other is a resonance portion 22.

A cavity 24 having a dome shape is formed between the substrate 10 and the lower electrode 12 below the resonance portion 22. The dome shape is a bulge in which a height of a center portion of the cavity 24 is larger than a height of a circumference of the cavity 24. A guidance passage 26 for etching of a sacrifice layer described later is provided under the lower electrode 12. An edge region of the guidance passage 26 is not covered by the first piezoelectric film 14, the insulating film 16 or the second piezoelectric film 18. A hole 28 is formed in the edge region of the guidance passage 26. An opening 30 allowing electrical connection with the lower electrode 12 is formed in the first piezoelectric film 14, the insulating film 16 and the second piezoelectric film 18.

Next, a description will be given of a method for manufacturing the piezoelectric thin-film resonator in accordance with the first embodiment, with reference to FIG. 4A through FIG. 4H. FIG. 4A through FIG. 4D illustrate a schematic cross sectional view corresponding to the line A-A of FIG. 3A. FIG. 4E through FIG. 4H illustrate a schematic cross sectional view corresponding to the line B-B of FIG. 3A.

Figure 4A:
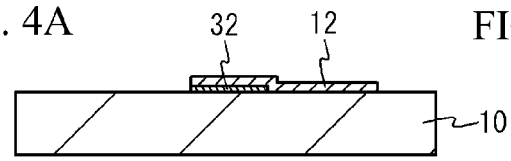
FIG. 4A through FIG. 4H illustrate a schematic cross sectional view illustrating a method for manufacturing a piezoelectric thin-film resonator in accordance with the first embodiment.
Figure 4E:
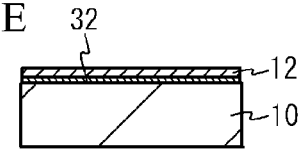

As illustrated in FIG. 4A and FIG. 4E, a sacrifice layer 32 made of MgO (magnesium oxide) or the like is formed on the substrate 10 by a sputtering method or a vapor deposition method. After that, the sacrifice layer 32 is left in a region where the cavity 24 is to be formed, through an exposure and an etching. The thickness of the sacrifice layer 32 is, for example, 20 nm. Next, the lower electrode 12 is formed on the substrate 10 and the sacrifice layer 32 by sputtering a Ru target in an Ar atmosphere. After that, the lower electrode 12 is formed into a desirable shape through an exposure and an etching. A part of the lower electrode 12 is formed into a shape covering the sacrifice layer 32.

Figure 4B:
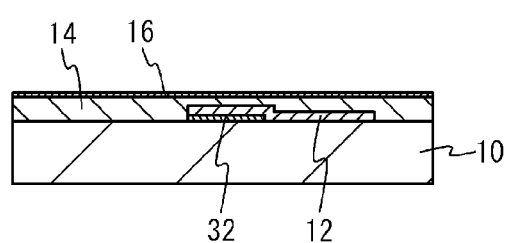
Figure 4F:
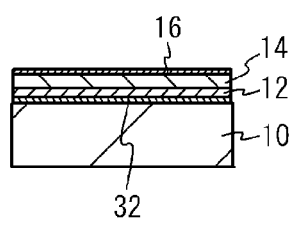

As illustrated in FIG. 4B and FIG. 4F, the first piezoelectric film 14 is formed on the substrate 10 and the lower electrode 12 by sputtering an Al target in Ar/$N_2$ mixed gas. Next, the insulating film 16 is formed on the first piezoelectric film 14 by sputtering a $SiO_2$ target in an Ar atmosphere. After that, Ar plasma is radiated to the upper face of the insulating film 16 for a few tens of seconds. And, the upper face of the insulating film 16 is flattened.

Figure 4C:
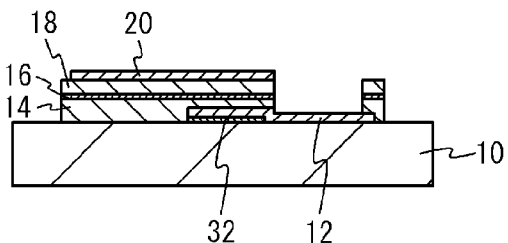
Figure 4G:
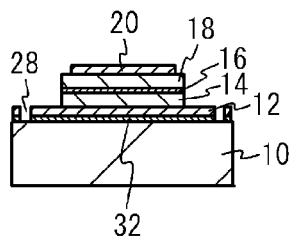

As illustrated in FIG. 4C and FIG. 4G, the second piezoelectric film 18 is formed on the insulating film 16 by sputtering an Al target in Ar/$N_2$ mixed gas. Next, the upper electrode 20 is formed on the second piezoelectric film 18 by sputtering a Ru target in an Ar atmosphere. The formation of the first piezoelectric film 14, the formation of the insulating film 16, the flattening of the upper face of the insulating film 16, the formation of the second piezoelectric film 18 and the formation of the upper electrode 20 are performed successively in a single vacuum equipment without breaking the vacuum. After that, the first piezoelectric film 14, the insulating film 16, the second piezoelectric film 18 and the upper electrode 20 are formed into a desirable shape through an exposure and an etching. Further, the hole 28 of the edge region of the guidance passage 26 is formed through an exposure and an etching. The hole 28 may be formed together with the lower electrode 12.

Figure 4D:
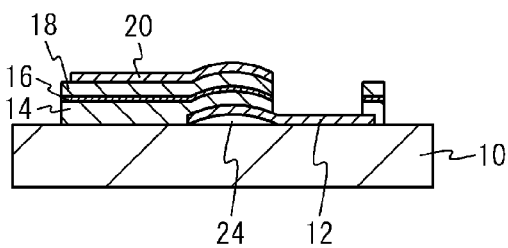
Figure 4H:
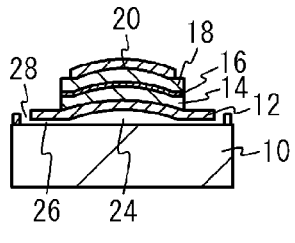

As illustrated in FIG. 4D and FIG. 4H, etching liquid for an etching of the sacrifice layer 32 is introduced from the hole 28 and passes through the guidance passage 26. Thereby, the sacrifice layer 32 is removed. Stress of a laminated films of the lower electrode 12, the first piezoelectric film 14, the insulating film 16, the second piezoelectric film 18 and the upper electrode 20 is set to act as compression stress by adjusting the sputtering condition. Thus, when the etching of the sacrifice layer 32 is completed, the laminated films expand and the cavity 24 having the dome shape is formed between the substrate 10 and the lower electrode 12.

Figure 5:
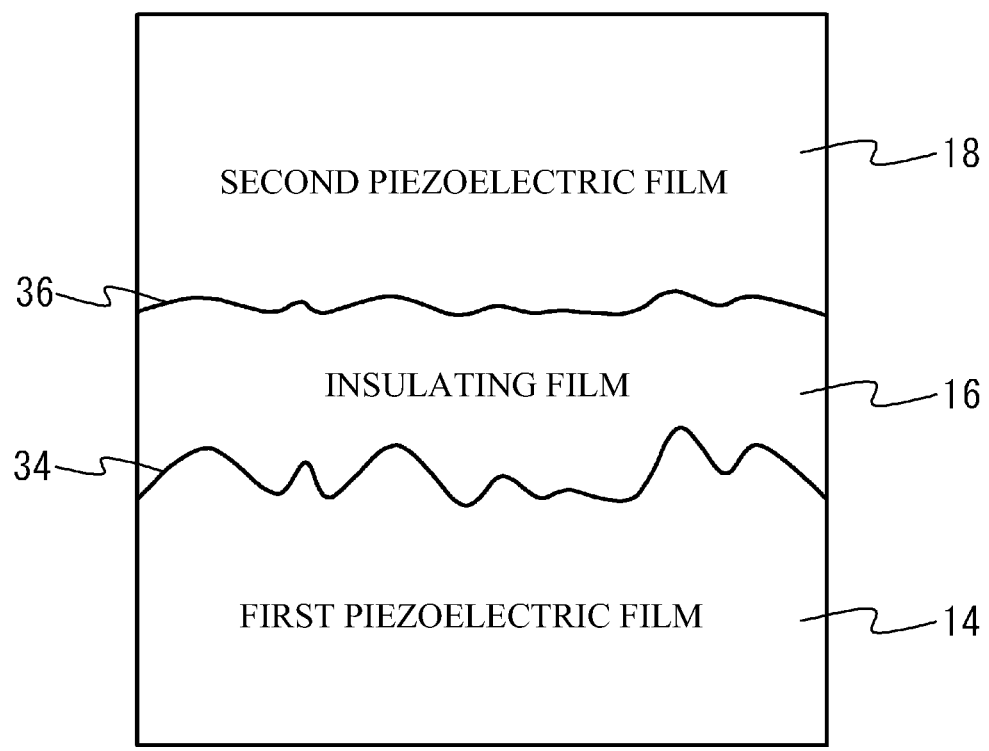
FIG. 5 illustrates a schematic cross sectional view illustrating flatness of an upper face of an insulating film.

Next, a description will be given of the flatness of the upper face of the insulating film 16. FIG. 5 illustrates a schematic cross sectional view illustrating the flatness of the upper face of the insulating film 16. As illustrated in FIG. 5, the flatness of an upper face 36 of the insulating film 16 is improved more than that of an upper face 34 of the first piezoelectric film 14 (that is, the lower face of the insulating film 16). This is because the Ar plasma is radiated to the upper face of the insulating film 16 after forming the insulating film 16, as described with reference to FIG. 4B and FIG. 4F. Here, the flatness of the upper face 34 of the first piezoelectric film 14 and the flatness of the upper face 36 of the insulating film 16 were measured. As the flatness, the RMS value of the upper face 34 of the first piezoelectric film 14 after forming the first piezoelectric film 14 and the RMS value of the upper face 36 of the insulating film 16 after flattening the insulating film 16 were measured with respect to 15 chips in three areas on a wafer manufactured by the manufacturing method as illustrated in FIG. 4A through FIG. 4H. An average of the RMS value of the upper face 34 of the first piezoelectric film 14 of the 15 chips was 1.7 nm. On the other hand, an average of the RMS value of the upper face 36 of the insulating film 16 of the 15 chips was 0.6 nm. It was found that the flatness of the upper face 36 of the insulating film 16 was improved and the RMS value was reduced to half or less, by radiating the Ar plasma to the upper face 36 of the insulating film 16.

Next, the c-axis orientation of the second piezoelectric film 18 formed on the upper face 36 of the insulating film 16 of which flatness was improved was measured. The c-axis orientation was measured by measuring a half-value width of a rocking curve of X-ray diffraction of the second piezoelectric film 18. The half-value width of the second piezoelectric film 18 was approximately 3 degrees that was a preferable value. When the second piezoelectric film 56 is formed on the upper face 62 of the insulating film 54 having bad flatness as in the case of the piezoelectric thin-film resonator of the first comparative example, the c-axis orientation of the second piezoelectric film 56 may be disturbed. However, the disturbance of the c-axis orientation of the second piezoelectric film 18 is suppressed by forming the second piezoelectric film 18 on the upper face 36 of the insulating film 16 of which flatness is improved as in the case of the piezoelectric thin-film resonator of the first embodiment.

Figure 6A:
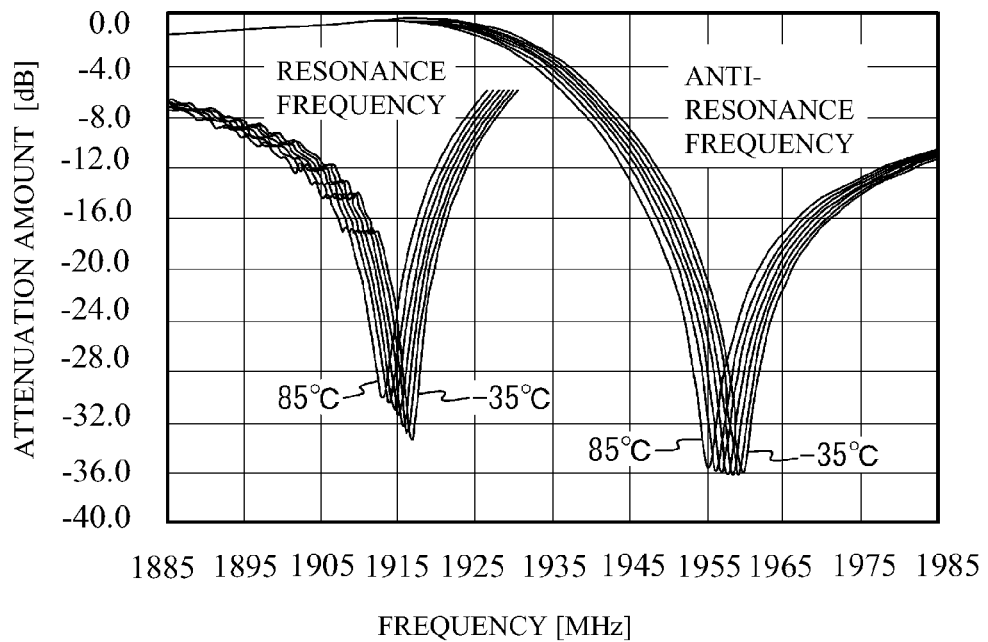
FIG. 6A illustrates a measurement result of temperature characteristics of frequency of the piezoelectric thin-film resonator in accordance with the first embodiment.
Figure 6B:
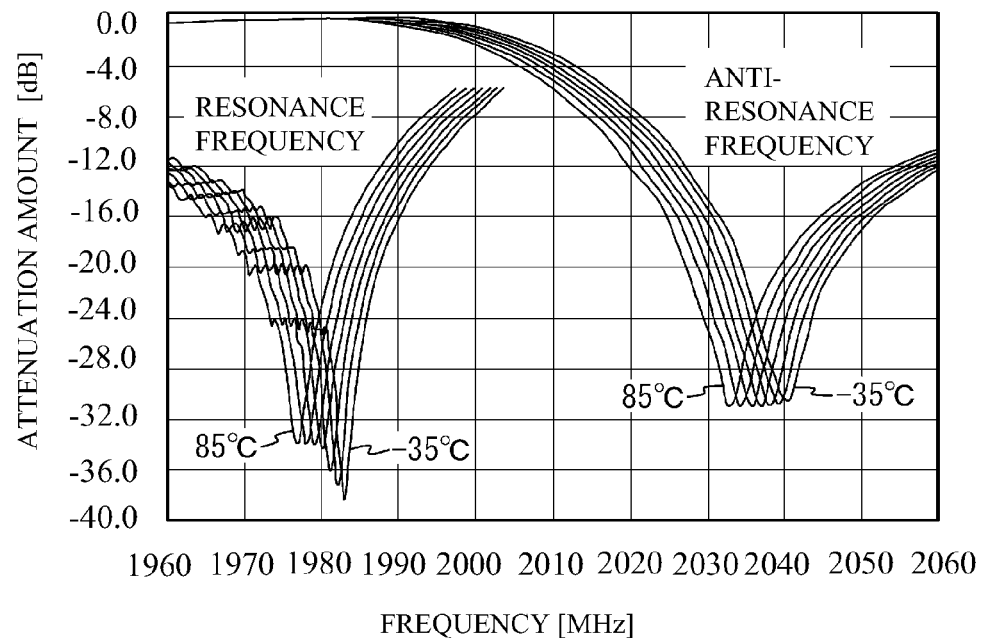
FIG. 6B illustrates a measurement result of temperature characteristics of frequency of a piezoelectric thin-film resonator in accordance with a second comparative example.

Next, the temperature characteristics of frequency of the piezoelectric thin-film resonator in accordance with the first embodiment were measured. FIG. 6A illustrates a measurement result of the temperature characteristics of frequency of the piezoelectric thin-film resonator. For comparison, FIG. 6B illustrates temperature characteristics of frequency of a piezoelectric thin-film resonator in accordance with a second comparative example having the same structure as the piezoelectric thin-film resonator in accordance with the first embodiment except for that the insulating film 16 is not provided. In the measuring of the temperature characteristics, a temperature was changed from –35 degrees C. to 85 degrees C. with 20 degrees C. increments, and a resonance frequency and an anti-resonance frequency were measured As illustrated in FIG. 6A and FIG. 6B, the temperature coefficient of the resonance frequency of the piezoelectric thin-film resonator in accordance with the second comparative example is –27.3 ppm/C. deg. The temperature coefficient of the anti-resonance frequency of the piezoelectric thin-film resonator is –32.1 ppm/C. deg. On the other hand, the temperature coefficient of the resonance frequency of the piezoelectric thin-film resonator in accordance with the first embodiment is –17.6 ppm/C. deg. The temperature coefficient of the anti-resonance frequency of the piezoelectric thin-film resonator is −20.4 ppm/C. deg. The temperature coefficients of the resonance frequency and the anti-resonance frequency of the piezoelectric thin-film resonator in accordance with the first embodiment are improved by 10 ppm, compared to those of the piezoelectric thin-film resonator in accordance with the second comparative example.

This is because the insulating film 16 is made of $SiO_2$ or the like, the first piezoelectric film 14 and the second piezoelectric film 18 are made of AlN or the like, and the sign of the temperature coefficient of the elastic constant of the insulating film 16 is opposite to that of the first piezoelectric film 14 and the second piezoelectric film 18. And, the insulating film 16 is a region between the first piezoelectric film 14 and the second piezoelectric film 18 where the lower electrode 12 faces the upper electrode 20, and thereby the temperature characteristics of frequency are improved. The insulating film 16 may be provided in a part of the region (the resonance portion 22) where the lower electrode 12 faces the upper electrode 20. However, in view of improving the temperature characteristics of frequency, it is preferable that the insulating film 16 covers whole of the region (the resonance portion 22) where the lower electrode 12 faces the upper electrode 20.

As mentioned above, in accordance with the first embodiment, as illustrated in FIG. 3B, the lower electrode 12 is provided on the substrate 10, the first piezoelectric film 14 and the second piezoelectric film 18 are provided on the lower electrode 12, the upper electrode 20 having the region sandwiching the first piezoelectric film 14 and the second piezoelectric film 18 with the lower electrode 12 and facing the lower electrode 12 is provided on the second piezoelectric film 18. The insulating film 16 is provided between the first piezoelectric film 14 and the second piezoelectric film 18 where the lower electrode 12 faces the upper electrode 20. And, as illustrated in FIG. 5, the upper face of the insulating film 16 is flatter than the lower face of the insulating film 16. As illustrated in FIG. 4A through FIG. 4H, the lower electrode 12 is formed on the substrate 10, the first piezoelectric film 14 is formed on the lower electrode 12, and the insulating film 16 is formed on the first piezoelectric film 14. And, the upper face of the insulating film 16 is flattened. After that, the second piezoelectric film 18 is formed on the insulating film 16 of which upper face is flattened. The upper electrode 20 is formed on the second piezoelectric film 18 so that a part of the upper electrode 20 sandwiches the first piezoelectric film 14, the insulating film 16 and the second piezoelectric film 18 with the lower electrode 12 and faces the lower electrode 12. Through the processes, the piezoelectric thin-film resonator is manufactured.

As illustrated in FIG. 6A, the temperature characteristics of frequency are improved because the insulating film 16 is provided between the first piezoelectric film 14 and the second piezoelectric film 18 where the lower electrode 12 faces the upper electrode 20. The disturbance of the c-axis orientation of the second piezoelectric film 18 is suppressed, because the second piezoelectric film 18 is formed on the upper face 36 of the insulating film 16 of which flatness is improved. Thus, the resonance sharpness (Q-value) can be improved, the electromechanical coupling coefficient ($K^2$) can be improved, and the spurious can be suppressed. Therefore, the resonance characteristics of the piezoelectric thin-film resonator can be improved. Therefore, in accordance with the first embodiment, the temperature characteristics of frequency can be improved, the disturbance of the orientation of the piezoelectric film can be suppressed, and preferable resonance characteristics can be achieved.

In view of suppression of the disturbance of the c-axis orientation of the second piezoelectric film 18, it is preferable that the RMS value of the upper face 36 of the insulating film 16 is smaller than the RMS value of the lower face (that is, the upper face 34 of the first piezoelectric film 14) by 30% or more. It is more preferable that the RMS value of the upper face 36 is smaller than that of the lower face by 50% or more. It is still more preferable that the RMS value of the upper face 36 is smaller than that of the lower face by 80% or more. In view of suppression of the disturbance of the c-axis orientation of the second piezoelectric film 18, it is preferable that the RMS value of the upper face 36 of the insulating film 16 is 1.0 nm or less. It is more preferable that the RMS value of the upper face 36 is 0.8 nm or less. It is still more preferable that the RMS value of the upper face 36 is 0.6 nm or less.

As illustrated in FIG. 4C and FIG. 4G, it is preferable that the formation of the first piezoelectric film 14, the formation of the insulating film 16, the flattening of the upper face of the insulating film 16, and the formation of the second piezoelectric film 18 are performed successively in a single vacuum equipment without breaking the vacuum. In this case, adherence of impurity is restrained at an interface between the first piezoelectric film 14 and the insulating film 16 and at an interface between the insulating film 16 and the second piezoelectric film 18. That is, the insulating film 16 can be formed on the first piezoelectric film 14 at which the adherence of impurity is restrained. The second piezoelectric film 18 can be formed on the flattened upper face of the insulating film 16 at which the adherence of impurity is restrained. Therefore, preferable resonance characteristics can be achieved.

In FIG. 4B and FIG. 4F, the Ar plasma is radiated to the upper face of the insulating film 16, and the upper face of the insulating film 16 is flattened. However, plasma of inert gas other than Ar gas may be radiated. That is, the plasma of the inert gas other than Ar gas may be used.

In the above-mentioned embodiment, the piezoelectric film is made of two layers of the first piezoelectric film 14 and the second piezoelectric film 18, and the insulating film 16 is a single layer provided between the first piezoelectric film 14 and the second piezoelectric film 18. However, the structure is not limited. The piezoelectric film may include more than two layers such as three layers or four layers. In this case, the insulating film 16 is provided between each two piezoelectric films. That is, the piezoelectric film has only to include at least two layers, and each insulating film has only to be provided between each two piezoelectric films.

The insulating film 16 is made of $SiO_2$ in the above-mentioned embodiment. However, the structure is not limited. The insulating film 16 may be made of other materials, if the insulating film 16 has the temperature coefficient of which sign is opposite to the sign of the temperature coefficient of the elastic constant of the first piezoelectric film 14 and the second piezoelectric film 18 in order to act as the temperature compensation film. For example, an insulating film in which another element is doped in silicon oxide may be used as the insulating film 16. That is, the insulating film 16 may be an insulating film mainly made of silicon oxide. The insulating film 16 may be made of a material of which sonic temperature coefficient is positive.

The first piezoelectric film 14 and the second piezoelectric film 18 are made of AlN in the above-mentioned embodiment. However, the structure is not limited. The first piezoelectric film 14 and the second piezoelectric film 18 may be made of aluminum nitride or another aluminum nitride in which another element is doped. That is, the first piezoelectric film 14 and the second piezoelectric film 18 may be made of aluminum nitride or another aluminum nitride in which impurity is doped. The first piezoelectric film 14 and the second piezoelectric film 18 may be made of zinc oxide or another zinc oxide in which another element is doped. It is preferable that the first piezoelectric film 14 is made of the same material as the second piezoelectric film 18. The thickness of the first piezoelectric film 14 may be different from that of the second piezoelectric film 18. In this case, the insulating film 16 between the first piezoelectric film 14 and the second piezoelectric film 18 is located on the lower electrode 12 side or the upper electrode 20 side.

The substrate 10 is not limited to the Si substrate, and may be a glass substrate, a GaAs substrate or the like. The lower electrode 12 and the upper electrode 20 may be made of a metal material such as Al, Cu, Mo, W, Ta, Pt, Rh, Ir, Cr, or Ti other than Ru.

FIG. 3B illustrates the piezoelectric thin-film resonator of FBAR type in which the dome-shaped cavity 24 is formed between the substrate 10 and the lower electrode 12. However, the structure is not limited. A piezoelectric thin-film resonator of FBAR type in which a part of the substrate 10 is removed and thereby the cavity 24 is formed in the substrate 10 may be used, as in the case of a first modified embodiment of the first embodiment. A piezoelectric thin-film resonator of SMR type may be used as in the case of a second modified embodiment of the first embodiment.

Figure 7:
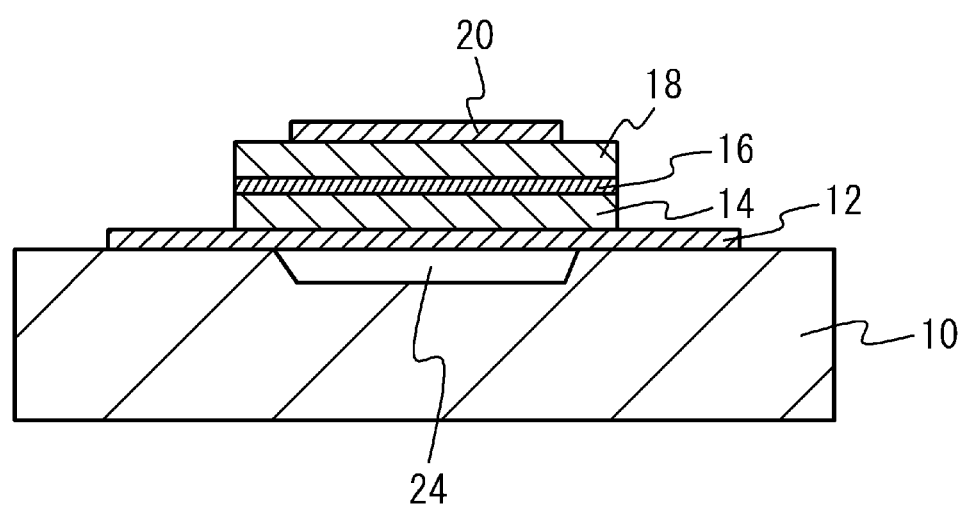
FIG. 7 illustrates a schematic cross sectional view of a piezoelectric thin-film resonator in accordance with a first modified embodiment of the first embodiment.

FIG. 7 illustrates a schematic cross sectional view of the piezoelectric thin-film resonator in accordance with the first modified embodiment of the first embodiment. As illustrated in FIG. 7, a part of the substrate 10 is removed, and a recess is formed in the upper face of the substrate 10. The lower electrode 12 is provided on the substrate 10 so as to cover the recess. Thus, the cavity 24 is formed under the lower electrode 12. The first piezoelectric film 14, the insulating film 16, the second piezoelectric film 18 and the upper electrode 20 are laminated on the lower electrode 12 in this order. The region (resonance portion) where the first piezoelectric film 14, the insulating film 16 and the second piezoelectric film 18 are sandwiched, and the lower electrode 12 faces the upper electrode 20 is positioned above the cavity 24.

As illustrated in FIG. 7, the insulating film 16 is provided between the first piezoelectric film 14 and the second piezoelectric film 18 where the lower electrode 12 faces the upper electrode 20, and the upper face of the insulating film 16 is flattened more than the lower face of the insulating film 16, in the piezoelectric thin-film resonator of FBAR type in which the cavity 24 is formed in the substrate 10. This results in improving of the temperature characteristics of frequency, suppressing of disturbance of the orientation of the piezoelectric film, and achieving of preferable resonance characteristics. The cavity 24 may be a via hole penetrating the substrate 10 to the lower face of the substrate 10.

Figure 8:
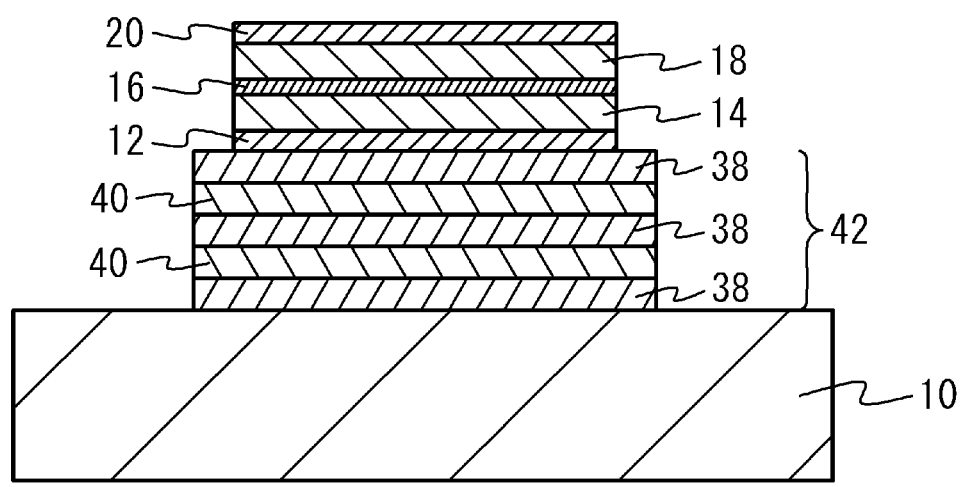
FIG. 8 illustrates a schematic cross sectional view of a piezoelectric thin-film resonator in accordance with a second modified embodiment of the first embodiment.

FIG. 8 illustrates a schematic cross sectional view of the piezoelectric thin-film resonator in accordance with the second modified embodiment of the first embodiment. As illustrated in FIG. 8, an acoustic multilayer film 42 is provided on the substrate 10. In the acoustic multilayer film 42, a low acoustic impedance film 38 having a thickness of λ/4 and a high acoustic impedance film 40 having a thickness of λ/4 are laminated alternately. The "λ" is a wavelength of an acoustic wave. The lower electrode 12, the first piezoelectric film 14, the insulating film 16, the second piezoelectric film 18 and the upper electrode 20 are laminated on the acoustic multilayer film 42 in this order. Thus, the piezoelectric thin-film resonator of SMR type does not have a cavity, and the region (resonance portion) where the first piezoelectric film 14, the insulating film 16 and the second piezoelectric film 18 are sandwiched and the lower electrode 12 faces the upper electrode 20 is positioned above the acoustic multilayer film 42.

As illustrated in FIG. 8, even if the piezoelectric thin-film resonator is a SMR type in which the acoustic multilayer film 42 is provided instead of the cavity, the insulating film 16 is provided between the first piezoelectric film 14 and the second piezoelectric film 18 where the lower electrode 12 faces the upper electrode 20, and the upper face of the insulating film 16 is flatter more than the lower face of the insulating film 16. This results in improving of the temperature characteristics of frequency, suppressing of the disturbance of the orientation of the piezoelectric film, and achieving of preferable resonance characteristics.

Second Embodiment

Figure 9:
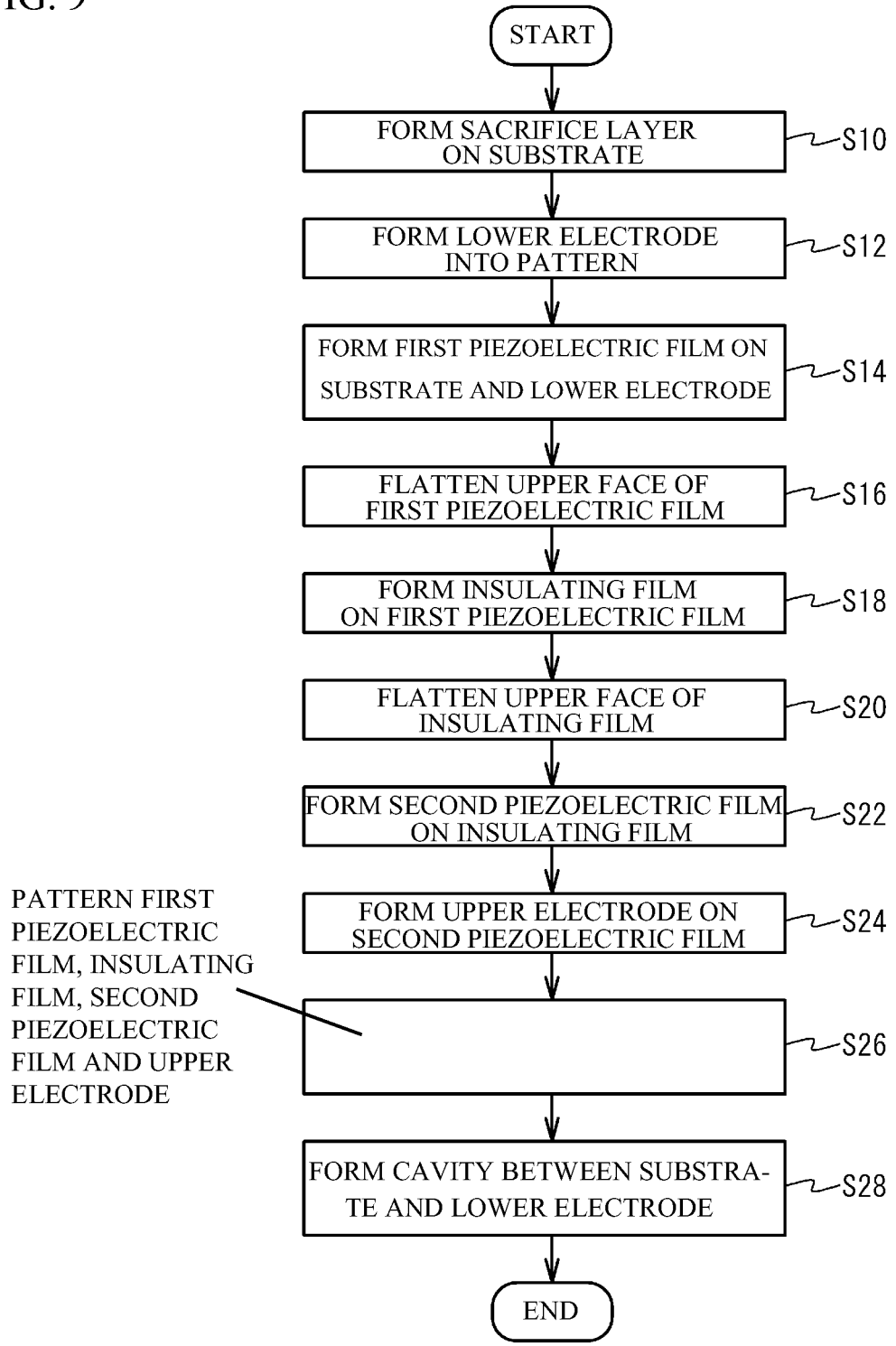
FIG. 9 illustrates an example of a flowchart of a manufacturing method of a piezoelectric thin-film resonator in accordance with a second embodiment.

FIG. 9 illustrates an example of a flowchart of a method for manufacturing a piezoelectric thin-film resonator in accordance with a second embodiment. A top view and a cross sectional view of the piezoelectric thin-film resonator in accordance with the second embodiment are the same as those of the first embodiment. FIG. 3A through FIG. 3C illustrate the views. Therefore the explanation is omitted. Cross sectional views illustrating the manufacturing method are the same as those of the first embodiment. FIG. 4A through FIG. 4H illustrate the views. Therefore, the explanation is omitted.

As illustrated in FIG. 9, the sacrifice layer 32 is formed in a region where the cavity 24 is to be formed (Step S10). Next, the lower electrode 12 is formed on the substrate 10 and the sacrifice layer 32. The lower electrode 12 is formed into a desirable pattern (Step S12).

Next, the first piezoelectric film 14 is formed on the substrate 10 and the lower electrode 12 (Step S14). Then, Ar plasma is radiated to the upper face of the first piezoelectric film 14, and the upper face of the first piezoelectric film 14 is flattened (Step S16). Next, the insulating film 16 is formed on the first piezoelectric film 14 of which upper face is flattened (Step S18). Then, Ar plasma is radiated to the upper face of the insulating film 16, and the upper face of the insulating film 16 is flattened (Step S20).

Next, the second piezoelectric film 18 is formed on the insulating film 16 of which upper face is flattened (Step S22). Then, the upper electrode 20 is formed on the second piezoelectric film 18 (Step S24). The formation of the first piezoelectric film 14, the flattening of the first piezoelectric film 14, the formation of the insulating film 16, the flattening of the insulating film 16, the formation of the second piezoelectric film 18 and the formation of the upper electrode 20 are performed in a single vacuum equipment without breaking the vacuum. Next, the first piezoelectric film 14, the insulating film 16, the second piezoelectric film 18 and the upper electrode 20 are formed into a desirable pattern (Step S26). Then, the sacrifice layer 32 is etched. Thereby, the cavity 24 having a dome shape is formed between the substrate 10 and the lower electrode 12 (Step S28).

As mentioned above, the second embodiment is different from the first embodiment in a point that the upper face of the first piezoelectric film 14 is flattened after the formation of the first piezoelectric film 14, and the insulating film 16 is formed on the first piezoelectric film 14 of which upper face is flattened. In the first embodiment, as illustrated in FIG. 5, the flatness of the upper face 34 of the first piezoelectric film 14 is not good. However, in the second embodiment, the upper face of the first piezoelectric film 14 is improved because the upper face of the first piezoelectric film 14 is flattened. In the second embodiment, the flatness of the upper face of the insulating film 16 at the time when the formation of the insulating film 16 is finished is more preferable than the first embodiment, because the insulating film 16 is formed on the upper face of the first piezoelectric film 14 of which flatness is improved. And the upper face of the insulating film 16 is further flattened. Therefore, the flatness of the upper face of the insulating film 16 is improved more than the first embodiment. Accordingly, the disturbance of the c-axis orientation of the second piezoelectric film 18 formed on the upper face of the insulating film 16 can be suppressed more. And more preferable resonance characteristics can be achieved.

It is preferable that the formation of the first piezoelectric film 14, the flattening of the upper face of the first piezoelectric film 14, the formation of the insulating film 16, the flattening of the upper face of the insulating film 16 and the formation of the second piezoelectric film 18 are performed in series in a single vacuum equipment without breaking vacuum. This allows that the insulating film 16 is formed on the flattened upper face of the first piezoelectric film 14 where adherence of impurity is restrained, and the second piezoelectric film 18 is formed on the flattened upper face of the insulating film 16 where adherence of impurity is restrained. Therefore, preferable resonance characteristics can be achieved.

The upper face of the first piezoelectric film 14 may be flattened by radiating plasma of inert gas other than Ar gas.

In the second embodiment, the piezoelectric thin-film resonator of FBAR type in which the cavity 24 is formed in the substrate 10 may be used as in the case of the first modified embodiment of the first embodiment. And, the piezoelectric thin-film resonator of SMR type in which the acoustic multilayer film 42 is provided instead of the cavity may be used as in the case of the second modified embodiment of the first embodiment.

The present invention is not limited to the specifically described embodiments, but other embodiments and variations may be made without departing from the scope of the claimed invention.

What is claimed is:

1. A piezoelectric thin-film resonator comprising:
a lower electrode provided on a substrate;
a piezoelectric film that is provided on the lower electrode and includes at least two layers;
an upper electrode that is provided on the piezoelectric film and has a region sandwiching the piezoelectric film with the lower electrode and facing the lower electrode; and
an insulating film that is provided under said region of the upper electrode between the at least two layers and that is in direct contact with each of the at least two layers,
wherein an upper face of the insulating film is flatter than a lower face of the insulating film.

2. The piezoelectric thin-film resonator as claimed in claim 1, wherein an RMS value of the upper face of the insulating film is smaller than an RMS value of the lower face of the insulating film by 30% or more.

3. The piezoelectric thin-film resonator as claimed in claim 1, wherein:
the piezoelectric film has a structure of two layers; and
the insulating film is a single layer provided between the two layers of the piezoelectric film.

4. The piezoelectric thin-film resonator as claimed in claim 1, wherein the insulating film is an insulating film of which main component is silicon oxide.

5. The piezoelectric thin-film resonator as claimed in claim 1, wherein the piezoelectric film is aluminum nitride or another aluminum nitride in which an impurity is doped.

6. A method for manufacturing a piezoelectric thin-film resonator comprising:
forming a lower electrode on a substrate;
depositing a first piezoelectric film on the lower electrode;
depositing an insulating film on the first piezoelectric film;
flattening an upper face of the insulating film;
depositing a second piezoelectric film on the insulating film of which upper face is flattened; and
forming an upper electrode on the second piezoelectric film so as to have a region sandwiching the first piezoelectric film, the insulating film and the second piezoelectric film with the lower electrode and facing the lower electrode.

7. The method as claimed in claim 6, wherein the forming of the first piezoelectric film, the forming of the insulating film, the flattening of the upper face of the insulating film and the forming of the second piezoelectric film are performed in series in a single vacuum equipment without breaking vacuum.

8. The method as claimed in claim 6, wherein the flattening of the upper face of the insulating film is performed with use of inert gas plasma.

9. The method as claimed in claim 6 further comprising flattening an upper face of the first piezoelectric film,
wherein the forming of the insulating film includes forming the insulating film on the first piezoelectric film of which upper face is flattened.

10. The piezoelectric thin-film resonators as claimed in claim 1, wherein the insulating film has an elastic constant of a temperature coefficient of which sign is opposite to a sign of a temperature coefficient of an elastic constant of the piezoelectric film.

11. The method as claimed in claim 6, wherein the first piezoelectric film, the insulating film and the second piezoelectric film are deposited by sputtering.

* * * * *